United States Patent [19]
Takehara

[11] Patent Number: 5,340,459
[45] Date of Patent: Aug. 23, 1994

[54] REACTIVE SPUTTERING SYSTEM

[75] Inventor: Kei Takehara, Tokyo, Japan

[73] Assignee: NEC Corporation, Japan

[21] Appl. No.: 978,982

[22] Filed: Nov. 19, 1992

[30] Foreign Application Priority Data

Nov. 22, 1991 [JP] Japan .................... 3-334375

[51] Int. Cl.⁵ .............................. C23C 14/34
[52] U.S. Cl. .............................. 204/298.07
[58] Field of Search ..................... 204/298.07

[56] References Cited

U.S. PATENT DOCUMENTS

| | | | |
|---|---|---|---|
| 4,572,842 | 2/1986 | Dietrich et al. | 427/571 |
| 5,108,571 | 4/1992 | Ludwig et al. | 204/192.13 |
| 5,135,581 | 8/1992 | Tran et al. | 136/256 |
| 5,169,509 | 12/1992 | Latz et al. | 204/298.03 |

FOREIGN PATENT DOCUMENTS

| | | | |
|---|---|---|---|
| 64-4473 | 1/1989 | Japan | 204/298.07 |
| 2-205674 | 8/1990 | Japan | 204/298.07 |
| 3-115565 | 5/1991 | Japan | 204/298.07 |
| 3-166366 | 7/1991 | Japan | 204/298.07 |

*Primary Examiner*—Aaron Weisstuch
*Attorney, Agent, or Firm*—Laff, Whitesel, Conte & Saret

[57] ABSTRACT

A reactive sputtering system is provided with a side gas distribution pipe for introducing a reactive gas and argon gas into a reaction chamber and a ring-shaped gas distribution pipe for introducing the argon gas or reactive gas into the reaction chamber independently of the side gas distribution pipe, whereby the concentration of the reactive gas can be controlled with respect to a target in the diameter direction thereof to equalize the reaction between the reactive gas and the target material above the surface of the target and thus to provide an improved uniformity of the quality film.

10 Claims, 4 Drawing Sheets

REACTIVE SPUTTERING SYSTEM

BACKGROUND OF THE INVENTION

1. Field of the Invention

The present invention relates to a reactive sputtering system and more particularly to a reactive sputtering system having a plurality of gas distribution systems.

2. Description of the Prior Art

The reactive sputtering process is a thin film forming process wherein a target material is sputtered while supplying a reactive gas to a processing chamber, and a reaction product of the sputtered target material with the reactive gas is then deposited on a surface of a substrate to form a thin film. FIGS. 1A and 1B are partially schematic views of a reactive sputtering system constructed in accordance with the prior art, in which FIG. 1A shows a side view of the reactive sputtering system and FIG. 1B shows a plan view of the same wherein a substrate is omitted.

In the prior art sputtering system, a mixture of the reactive gas with argon gas is introduced into the processing chamber through nozzles (not shown in FIGS. 1A and 1B) of a gas distribution pipe 3 in a constant ratio. When plasma is generated between a surface 1 of the substrate on which a thin film is to be formed and a target 2 mounted on a backing sheet 7, ions of the argon gas and the reactive gas collide against the surface of the target 2. As a result, the material of the target 2 is sputtered to deposit the thin film on the surface 1 of the substrate.

More exactly, the material of the target 2 is sputtered when the ions of the reactive gas and the argon gas collide against the surface of the target 2 or after collisions of the ions against the surface of the target 2. Thereafter, the sputtered target material travels through the plasma area in which the material is allowed to react with the ions of the reactive gas. A reaction product thus obtained is deposited on the surface 1 of the substrate.

In the above-mentioned prior art sputtering system, the concentrations of argon and of the reactive gas are maintained uniform outside of the outer periphery of the target. Within the plasma area, however, the argon gas and the reactive gas are ionized. The reactive gas travels, in passing through the plasma area while the reactive gas is allowed to react with the sputtered target material. Thus, the concentration of the reactive gas varies in the radial direction of the target 2. This leads to a difference in reaction rate.

The difference in reaction rate causes the composition of the film deposited on the surface of the substrate to vary so as to deteriorate the film properties along the substrate surface. Eventually, this will cause scattering in the properties of semiconductor devices in which such films are used and reduce the yield of the semiconductor devices, with a reduction in their reliability.

SUMMARY OF THE INVENTION

It is therefore an object of the present invention to provide a reactive sputtering system which can equalize the reaction of a reactive gas with a target material above the surface of the target.

To this end, the present invention provides a reactive sputtering system comprising a plurality of gas distribution pipes adapted to introduce a reactive gas during sputtering to react with a target material. The reacted target material is deposited on a surface of a substrate to be processed. The plurality of gas distribution pipes comprise a side gas distribution pipe which is disposed off to both sides of the target and is adapted to flow a gaseous mixture containing the reactive gas and a sputtering gas against the target. And a ring-shaped gas distribution pipe is disposed surrounding the target and between the target and the surface of the substrate. This pipe is adapted to flow the sputtering gas or reactive gas or a mixture thereof against the target. The amount of each gas to be introduced through the pipes is individually controlled.

DETAILED DESCRIPTION OF THE PREFERRED EMBODIMENTS

In accordance with the present invention, a plurality of gas distribution pipes comprising at least one side gas distribution pipe and at least one ring-shaped gas distribution pipe are disposed around a target member. A sputtering gas such as argon or the like and a reactive gas such as nitrogen, oxygen, or the like are introduced so as to flow against the target member through the plurality of gas distribution pipes. The amount of each gas to be introduced is individually and independently controlled. Thus, the concentration of the reactive gas can be controlled uniformly with respect to the target member in its diametral direction.

The present invention will now be described in more detail with reference to the drawings.

Figure 1A:
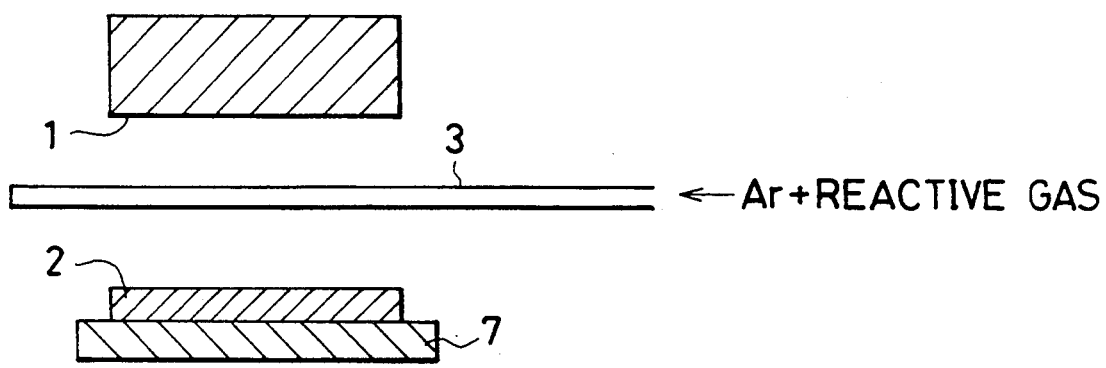
FIG. 1A is a partially schematic side view of a reactive sputtering system constructed in accordance with the prior art.
Figure 1B:
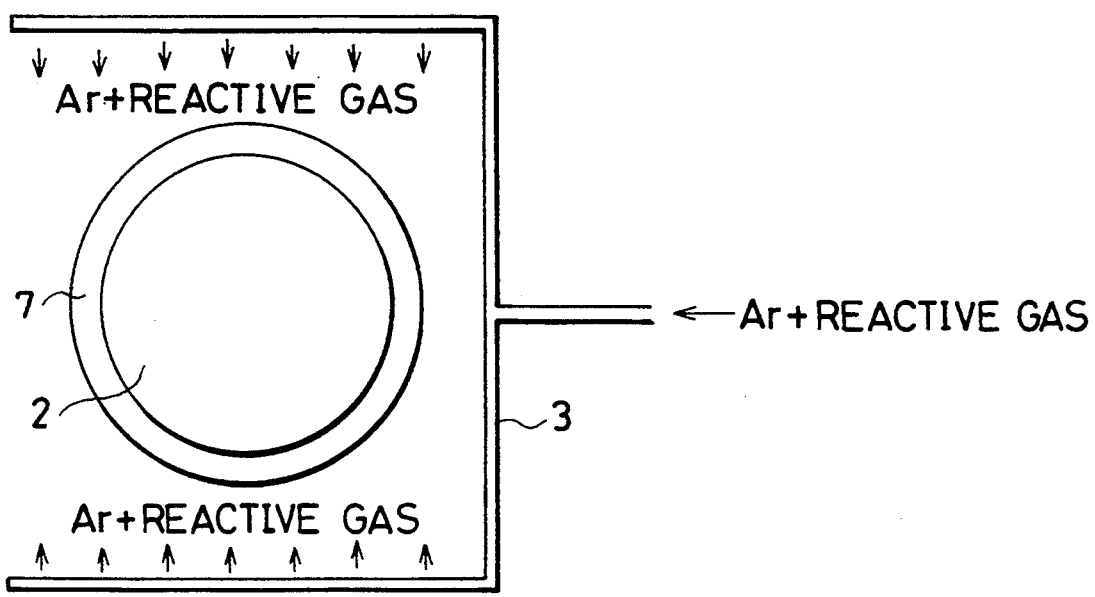
FIG. 1B is a partially schematic plan view of the reactive sputtering system of FIG. 1A in which the substrate is omitted.
Figure 2A:
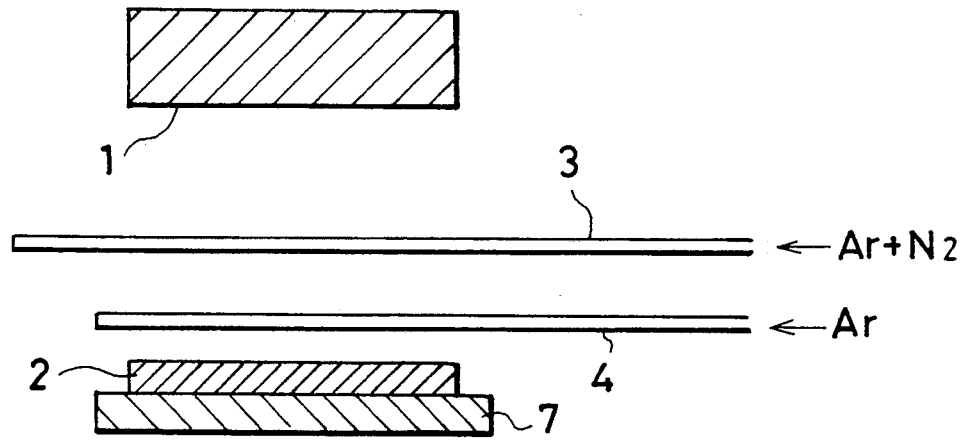
FIG. 2A is a partially schematic side view of a first embodiment of a reactive sputtering system constructed in accordance with the present invention.
Figure 2B:
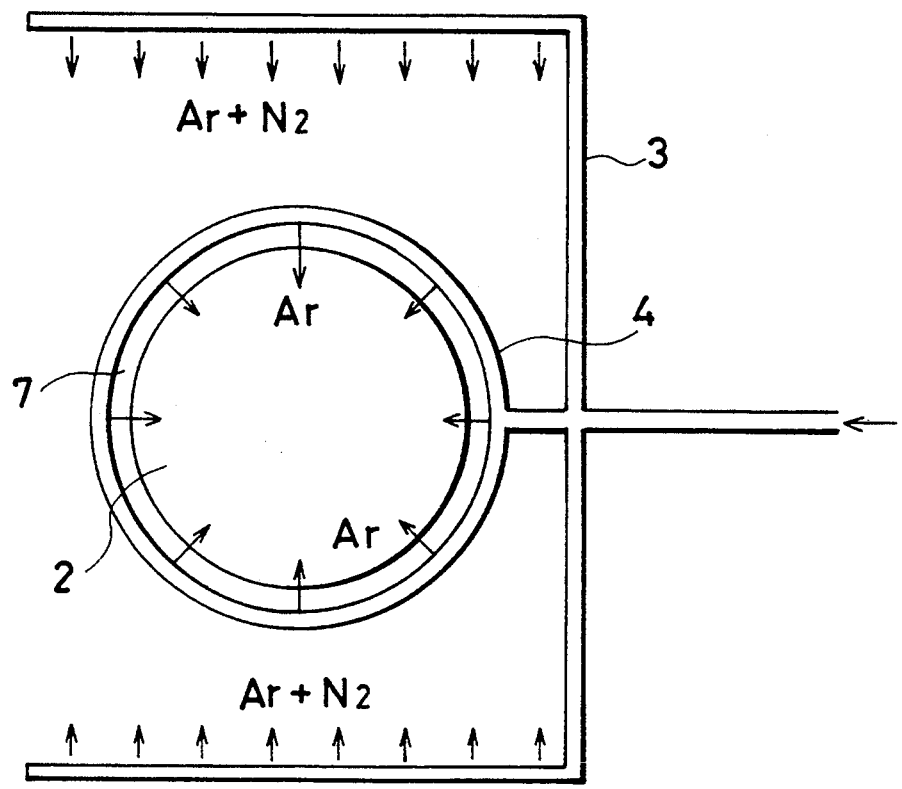
FIG. 2B is a partially schematic plan view of the reactive sputtering system of FIG. 2A in which the substrate is omitted.

Referring now to FIGS. 2A and 2B, there is shown a reactive sputtering system constructed in accordance with the present invention. A side gas distribution pipe 3 is disposed off to the upper right and left sides of the target 2 and positioned opposed to a surface 1 of a substrate to be processed and between the target 2 and the surface 1. The target 2 is mounted on a backing sheet 7. The side gas distribution pipe 3 is adapted to flow a mixture of a sputtering gas such as argon (Ar) with a reactive gas such as nitrogen ($N_2$) at an angle with respect to the top surface of the target 2. In the drawings, nozzles for flowing the gaseous mixture are not shown.

The reactive sputtering system further comprises a ring-shaped gas distribution pipe 4 located below the side gas distribution pipe 3, surrounding and directly above the target 2. The ring-shaped gas distribution pipe 4, which is disposed very close to the target 2, is adapted to flow the same sputtering gas as the above-mentioned sputtering gas at an angle with respect to the top surface of the target 2, whereby the effect is attained. In the drawings, nozzles for flowing the gas are not shown.

In order to deposit a thin film of TiN on the surface 1, the ratio of $N_2$ to Ar was set equal to 1:1, the sputtering pressure was equal to 2 mTorr, and the total flow rate of gases was equal to 120 sccm. More particularly, the flow rate of the gaseous mixture flowing from the side gas distribution pipe 3 was equal to 110 sccm while the flow rate of the sputtering gas flowing from the ring-shaped gas distribution pipe 4 was equal to 10 sccm.

When the side and ring-shaped gas distribution pipes 3 and 4 are used together, the concentration of $N_2$ is reduced at the peripheral part including the edge or fringe of the target 2. This is in comparison with the use of only the side gas distribution pipe 3, as seen from FIG. 3, which shows the relationship between any location on the target 2 and the concentration of $N_2$ at that location. Thus, different mixing ratios in the gas atmosphere near the target 2 can be provided at the central and peripheral parts of a plasma area. This enables the reaction between the sputtered target material and the reactive gas above the surface of the target 2 to be adjusted to equalize the concentration of nitrogen in a reaction product thus obtained, i.e. in the deposited film.

In the above-mentioned first embodiment, the reactive sputtering system may be provided with an additional ring-shaped gas distribution pipe disposed surrounding the target 2, and between the target 2 and the surface 1 of the substrate, for example, above the pipe 3 and very close to the surface 1 of the substrate, either in combination with the above-mentioned pipe 4 or alone. The another ring-shaped gas distribution pipe is adapted to flow the sputtering gas at an angle with respect to the top of the target and thus to control the concentration of $N_2$.

Furthermore, in the first embodiment, the side gas distribution pipe may be disposed either level with the target or off to the lower sides of the target. Or, a plurality of the side gas distribution pipes may be disposed at any location at the sides of the target, whereby the expected effect be attained.

Figure 4:
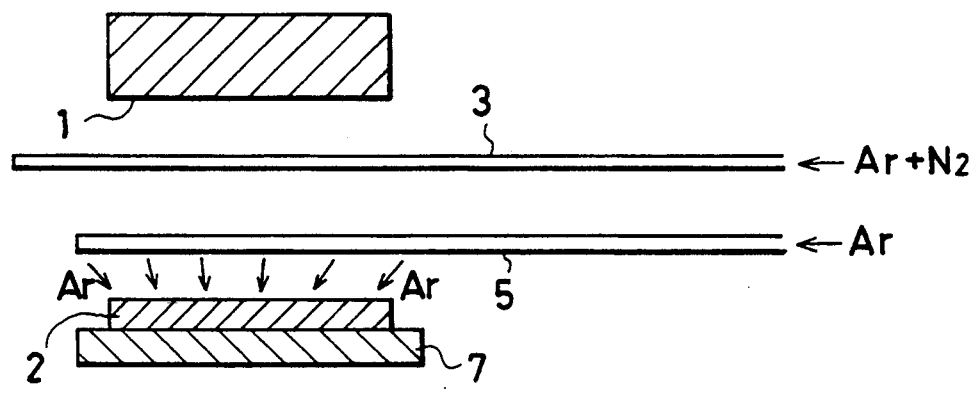
FIG. 4 is a partially schematic side view of a second embodiment of a reactive sputtering system constructed in accordance with the present invention.
Figure 5:
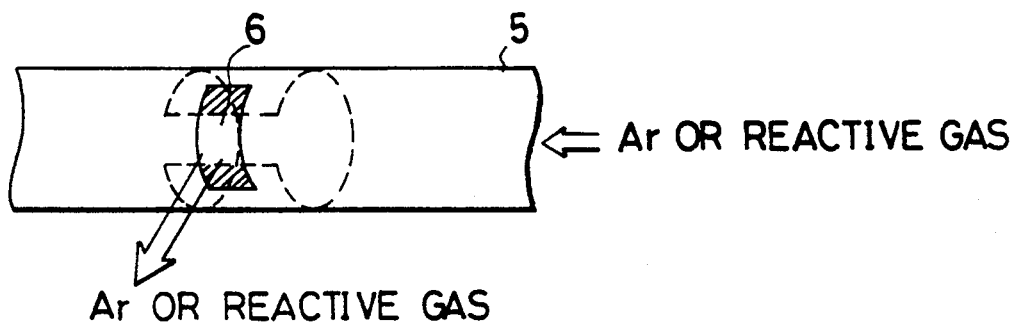
FIG. 5 is a partially schematic view of a gas distribution pipe provided with a movable nozzle used in the second embodiment.

FIG. 4 shows a second embodiment of the present invention wherein the piping for flowing the gases against the target 2 mounted on the backing sheet 7 is the same as in the first embodiment. In the drawing, nozzles for flowing the gases are not shown. The second embodiment comprises a side gas distribution pipe 3 for introducing a gaseous mixture of Ar and $N_2$ and a ring-shaped gas distribution pipe 5 for introducing Ar, the pipe 5 being provided with a movable nozzle or nozzles 6 as shown in FIG. 5.

Figure 6:
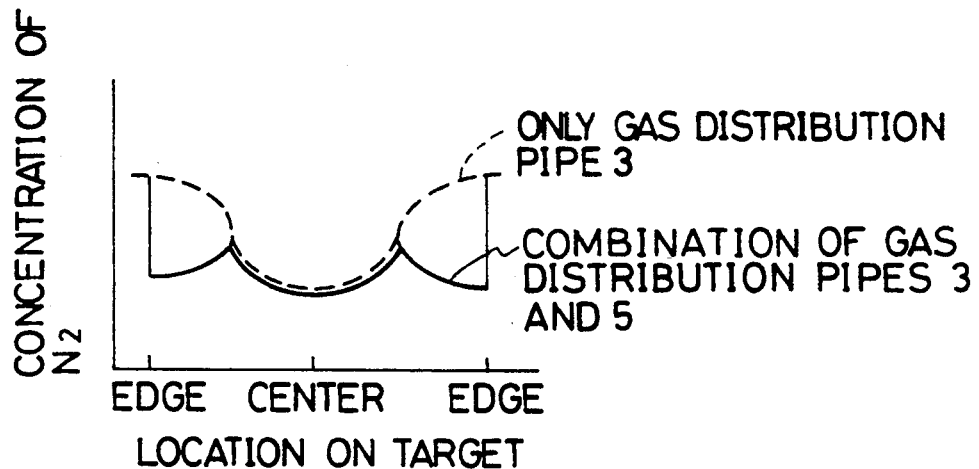
FIG. 6 is a graph illustrating variations of the concentration of nitrogen gas at any location on a target, in the second embodiment of the present invention.

In the second embodiment, the ratio of $N_2$ to Ar flow was set equal to 1:1, the sputtering pressure was 2 mTorr, and the total flow rate of gases was 120 sccm. when Ar or $N_2$ is flowed from the ring-shaped gas distribution pipe 5' through the movable nozzle 6, and target 2, the concentration of $N_2$ at the peripheral part including the edge or fringe of the target 2, can be reduced over a wider area as compared with the area of the first embodiment. This is seen from FIG. 6 showing the relation between any location on the target 2 and the concentration of $N_2$ at that location.

Thus, the reaction between the sputtered target material and the reactive gas is satisfactorily adjusted to equalize the concentration of nitrogen in a reaction product thus obtained, i.e. in the deposited film.

In the second embodiment, the reactive sputtering system may be provided with an additional ring-shaped gas distribution pipe in the same manner as in the first embodiment. The additional pipe may be provided with a movable nozzle. Moreover, in the second embodiment, the side gas distribution pipe may be disposed at any location in the same manner as in the first embodiment.

Figure 3:
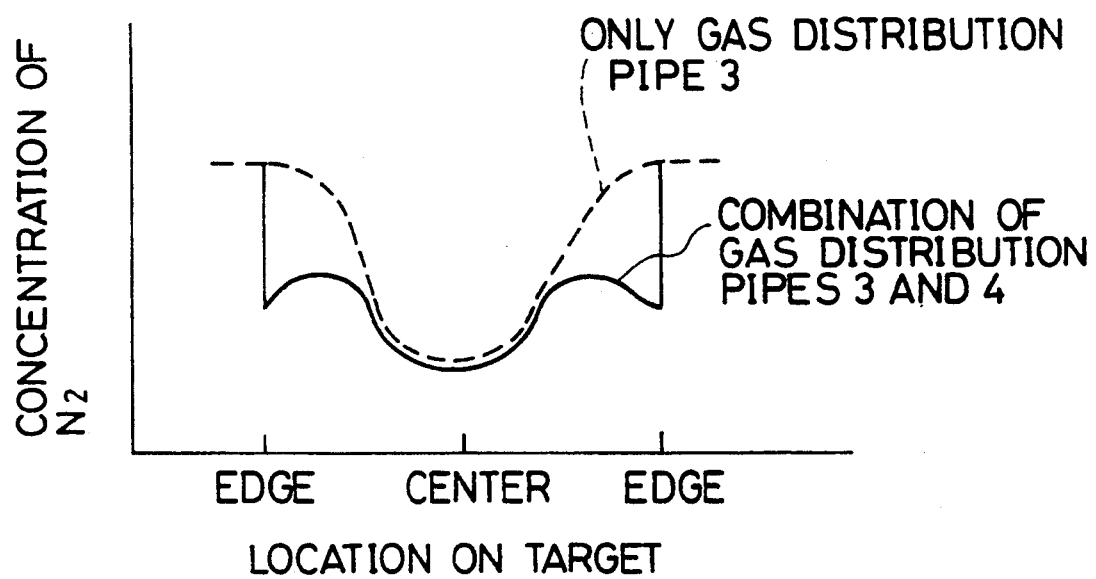
FIG. 3 is a graph illustrating variations of the concentration of nitrogen gas at any location on a target, in the first embodiment of the present invention.

With the increased concentration of nitrogen, the thin film of TiN has a reduced resistivity $\rho$. When the thickness of the deposited film is uniform, the distribution of sheet resistance $(\rho_s)$ of the thin film obtained by using the distribution of the $N_2$ concentration according to the present invention as shown in FIGS. 3 and 6 is exactly opposite to that of the $N_2$ concentration of the present invention as shown in FIGS. 3 and 6.

In the prior art, the amount of scatter in the sheet resistance $\rho_s$ was equal to about 7%, whereas in accordance with the present invention the amount of scatter in the sheet resistance $\rho_s$ was equal to 4% in the first embodiment and to 3.5% in the second embodiment.

In the present invention, the ratio of the reactive gas to the sputtering gas in the side gas distribution pipe may optionally vary according to need. Moreover, the reactive gas or a mixture of the reactive gas and the sputtering gas may be introduced through the ring-shaped gas distribution pipe so that the concentration of the reactive gas is uniformly controlled with respect to the target member in its diametral direction.

As will be apparent from the foregoing, the present invention can control the concentrations of the reactive gas at the peripheral and central parts of the plasma area when the sputtering gas, i.e. discharge gas, is introduced. As a result, the target material can be uniformly reacted with the reactive gas above the surface of the target to provide an improved uniformity of the quality throughout the film. Therefore, when fabricating semiconductor devices, variability in properties of the devices can be reduced, and also yield and reliability can be improved.

It should be readily apparent to those skilled in the art that various changes can be made in the system as described above. It is intended that such changes be covered within the spirit and scope of the claims appended hereto.

What is claimed is:

1. A reactive sputtering system, comprising a plurality of gas distribution pipes adapted to introduce a reactive gas during sputtering to react with a target material, the reacted target material being deposited on a surface of a substrate to be processed, said plurality of gas distribution pipes comprising a side gas distribution pipe which is disposed on both sides of said target and is adapted to flow a gaseous mixture containing said reactive gas and a sputtering gas against said target, and a ring-shaped gas distribution pipe which is disposed surrounding said target and between said target and the surface of said substrate and is adapted to flow said sputtering gas or reactive gas or a mixture thereof against said target, the amount of each gas to be introduced through said pipes being individually controllable.

2. The reactive sputtering system as defined in claim 1 wherein said ring-shaped gas distribution pipe is provided with at least one movable nozzle.

3. The reactive sputtering system as defined in claim 1 wherein said ring-shaped gas distribution pipe is disposed close to said target.

4. The reactive sputtering system as defined in claim 1 wherein said ring-shaped gas distribution pipe is disposed close to said target, and said plurality of gas distribution pipes further comprises another ring-shaped gas distribution pipe which is disposed surrounding said target, above said side gas distribution pipe and close to the surface of said substrate, and is adapted to flow said sputtering gas or reactive gas or a mixture thereof against said target.

5. The reactive sputtering system as defined in claim 1 wherein said side gas distribution pipe is disposed off the upper sides of said target.

6. The reactive sputtering system as defined in claim 1 wherein said side gas distribution pipe is disposed off the lower sides of said target.

7. The reactive sputtering system as defined in claim 1 wherein said side gas distribution pipe is disposed at a height level with said target.

8. The reactive sputtering system as defined in claim 1 wherein said side gas distribution pipe is disposed off to both the upper and lower sides of said target.

9. A reactive sputtering system comprising two gas distribution pipes and being adapted to introduce a reactive gas during sputtering to react with a target material, the reacted target material being deposited on a surface of a substrate to be processed, said two gas distribution pipes comprising a side gas distribution pipe which is disposed on both upper sides of the target and is adapted to flow a gaseous mixture containing said reactive gas and a sputtering gas against said target, and a ring-shaped gas distribution pipe which is disposed surrounding said target and close thereto and is adapted to flow said sputtering gas or reactive gas or a mixture thereof against said target, the amount of each gas to be introduced through said pipes being individually controllable.

10. The reactive sputtering system as defined in claim 9 wherein said ring-shaped gas distribution pipe is provided with at least one movable nozzle.

* * * * *